United States Patent [19]

Honma

[11] Patent Number: 5,532,758

[45] Date of Patent: Jul. 2, 1996

[54] FEEDBACK CLAMP CIRCUIT FOR ANALOG-TO-DIGITAL CONVERSION

[75] Inventor: Yoshihiro Honma, Tokyo, Japan

[73] Assignee: Canon Kabushiki Kaisha, Tokyo, Japan

[21] Appl. No.: 165,865

[22] Filed: Dec. 14, 1993

Related U.S. Application Data

[63] Continuation of Ser. No. 764,771, Sep. 24, 1991, abandoned.

[30] Foreign Application Priority Data

Sep. 25, 1990 [JP] Japan ................... 2-254640

[51] Int. Cl.⁶ ............................................. H04N 5/18
[52] U.S. Cl. .................... 348/694; 348/695; 348/697; 348/257; 348/572
[58] Field of Search .................. ; 348/257, 572, 348/694, 695, 697; 341/118, 139; H04N 5/18

[56] References Cited

U.S. PATENT DOCUMENTS

| | | | |
|---|---|---|---|
| 4,660,085 | 4/1987 | Harwood | 358/171 |
| 4,707,741 | 11/1987 | Stratton | 358/171 |
| 4,853,782 | 8/1989 | Asano et al. | 358/172 X |
| 4,965,669 | 10/1990 | Canfield et al. | 358/171 |
| 5,003,564 | 3/1991 | Fling | 358/172 X |
| 5,019,905 | 5/1991 | Pshtissky et al. | 358/172 X |
| 5,057,920 | 10/1991 | Wilkinson | 358/172 X |
| 5,084,700 | 1/1992 | Christopher | 358/172 X |
| 5,087,973 | 2/1992 | Kawahara | 358/171 X |
| 5,105,276 | 4/1992 | Schrock | 358/171 X |
| 5,134,487 | 7/1992 | Taguchi et al. | 348/572 |
| 5,191,422 | 3/1993 | Cho et al. | 358/172 |

FOREIGN PATENT DOCUMENTS 62-208763  9/1987  Japan ................ H04N 5/18

Primary Examiner—James J. Groody
Assistant Examiner—Cheryl Cohen
Attorney, Agent, or Firm—Fitzpatrick, Cella, Harper & Scinto

[57] ABSTRACT

An image processing apparatus includes an analog image signal clamp and an A/D converter that converts the analog image signal into an m bit digital signal. The clamp is controlled in accordance with an n+1 (m>n) bit digital image signal converted by the A/D converter and an n bit digital image signal portion of the m bit digital image signal is processed.

15 Claims, 5 Drawing Sheets

04H 02H
16mV
02H 01H
16mV
00H 00H
8-BIT 7-BIT

7-BIT MEMORY STRUCTURE
WITH 7-BIT A/D CONVERSION
DIGITAL FEEDBACK CLAMP 02H
02H 01H
8mV
01H
8mV 00H 00H
8-BIT 7-BIT

7-BIT MEMORY STRUCTURE
WITH 8-BIT A/D CONVERSION
DIGITAL FEEDBACK CLAMP 01H
02H
01H
00H 00H
n+2-BIT n-BIT n-BIT MEMORY STRUCTURE
WITH n+2-BIT A/D
CONVERSION DIGITAL
FEEDBACK CLAMP

FEEDBACK CLAMP CIRCUIT FOR ANALOG-TO-DIGITAL CONVERSION

This application is a continuation of application Ser. No. 07/764,771 filed Sep. 24, 1991, now abandoned.

BACKGROUND OF THE INVENTION

1. Field of the Invention

The present invention relates to an image processing apparatus and, more particularly, to a digital image signal processing apparatus.

2. Related Background Art

In a prestage of A/D conversion for performing digital signal processing, an input signal must be clamped to obtain a stable, accurate digital signal. Various types of conventional clamp schemes are available. A digital feedback clamp scheme is known as a clamp scheme for obtaining a stable signal almost free from temperature drifts and influences caused by variations in power source voltage.

FIG. 4 shows an arrangement of a conventional digital feedback clamp circuit. An operation of the conventional digital feedback clamp circuit will be described with reference to FIG. 4.

An input analog video signal is converted into a digital signal by an A/D (Analog-to-Digital) converter 10, and the digital signal is input to a comparator 12 through a latch circuit 11. The comparator 12 compares output data from the latch circuit 11 with reference data and outputs a comparison result. For example, if the reference data is set to be 01H (hexadecimal notation), when an output from the latch circuit 11 is 00H, an output from the comparator 12 goes to "H" (high level) to increase the clamp level. However, if the output form the comparator 12 is 01H, the output from the comparator 12 is set in a high-impedance state, thereby maintaining the present clamp level. If the output from the latch circuit 11 is 02H or more, the output from the comparator 12 goes to "L" (low level), thereby decreasing the clamp level.

A clamp gate circuit 13 outputs an output from the comparator 12 at a timing of a clamp pulse shown in FIG. 2B. An output from the clamp gate circuit 13 contains noise from a digital circuit. This noise is cut off by a low-pass filter (LPF) 14 to obtain a stable DC (Direct Current) level. The clamp level of an output from the LPF 14 is input to a clamp switch circuit 16 through a buffer 15. The clamp switch circuit 16 clamps the input signal (i.e., the analog video signal) in accordance with a pulse similar to the clamp pulse of the clamp gate circuit 13. The pedestal portion of the input analog video signal is kept at a predetermined level by the above operations, thereby performing a stable clamp operation.

In the conventional digital feedback clamp circuit described above, however, since comparison is performed by the comparator after the input signal is converted into the digital signal by the A/D converter, an error of about ±1 LSB corresponding to the least significant bit upon digital conversion occurs due to noise superposed on the input signal and quantization noise during A/D conversion. For this reason, when digital processing is to be performed with a smaller number of gradation bits caused by a reduction in memory capacity, one bit has a significant meaning. Even if digital feedback clamp is performed, the input signal as a whole varies within the range of ±1 bit. Therefore, digital processing with high precision cannot be performed, resulting in inconvenience.

SUMMARY OF THE INVENTION

It is an object of the present invention to provide an image processing apparatus capable of solving all the conventional problems described above.

It is another object of the present invention to provide an image processing apparatus capable of performing a clamp operation with high precision.

It is still another object of the present invention to provide an image processing apparatus suitable for processing primary color signals.

In order to achieve the above objects according to an aspect of the present invention, there is provided an image processing apparatus having an n-bit memory to perform digital signal processing, comprising a digital feedback clamp circuit for A/D-converting an input signal with gradation having n+1 or more bits, thereby performing a digital feedback clamp operation.

The above and other objects, features, and advantages of the present invention will be apparent from the following detailed description of preferred embodiments in conjunction with the accompanying drawings.

DETAILED DESCRIPTION OF THE PREFERRED EMBODIMENTS

Preferred embodiments of the present invention will be described in detail with reference to the accompanying drawings.

Figure 1:
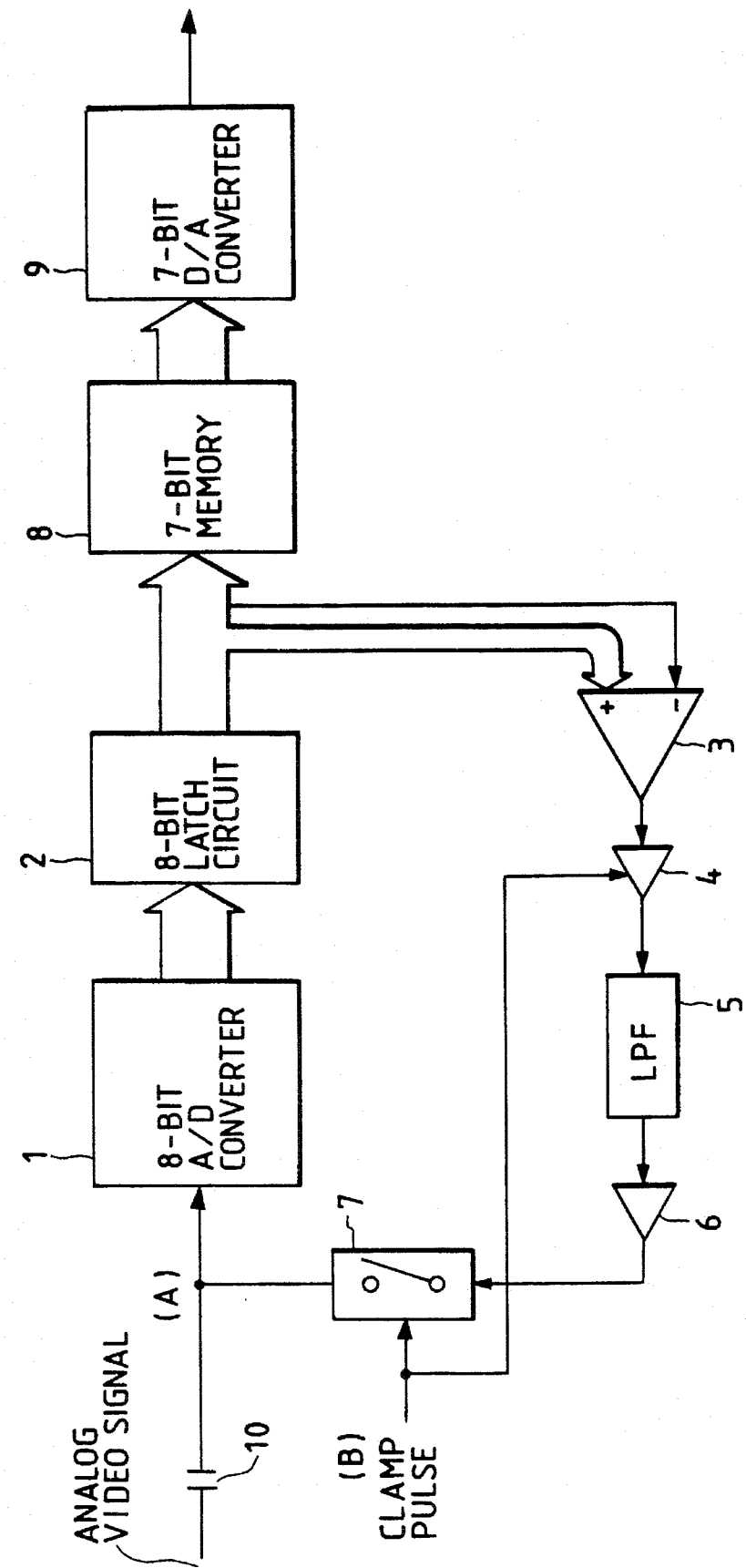
FIG. 1 is a block diagram showing an arrangement of a digital feed back clamp circuit according to an embodiment of the present invention.

FIG. 1 shows a circuit arrangement according to an embodiment of the present invention.

Referring to FIG. 1, a digital feedback clamp circuit of this embodiment includes an A/D converter 1, a latch circuit 2, and a comparator 3. The A/D converter 1 converts an input analog video signal into a digital signal with 8-bit gradation. The latch circuit 2 receives and outputs the digital signal in response to a clock having the same speed as that of a sampling clock. The comparator 3 compares data output from the latch circuit 2 with the least significant bit of the digital signal and outputs a state signal representing an "H" (Vcc potential), "L" (GND potential), or high-impedance state.

The digital feedback clamp circuit also includes a clamp gate circuit 4, a low-pass filter (LPF) 5, an output buffer circuit 6, and a clamp switch circuit 7. The clamp gate circuit 4 outputs an output from the comparator 3 at a timing of a clamp pulse shown in FIG. 2B. The LPF 5 eliminates a noise component contained in an output from the clamp gate circuit 4. The output buffer circuit 6 is connected to the output of the LPF 5. The clamp switch circuit 7 clamps the input signal at the same timing as that of the clamp pulse supplied to the clamp gate circuit 4.

The digital feedback clamp circuit further includes a memory 8, a D/A (Digital-to-Analog) converter 9, and a clamp capacitor 10. The memory 8 stores digital signals from the latch circuit 2 in a 7-bit gradation structure. The D/A converter 9 converts an output from the memory 8 into an analog signal.

Figure 2A:
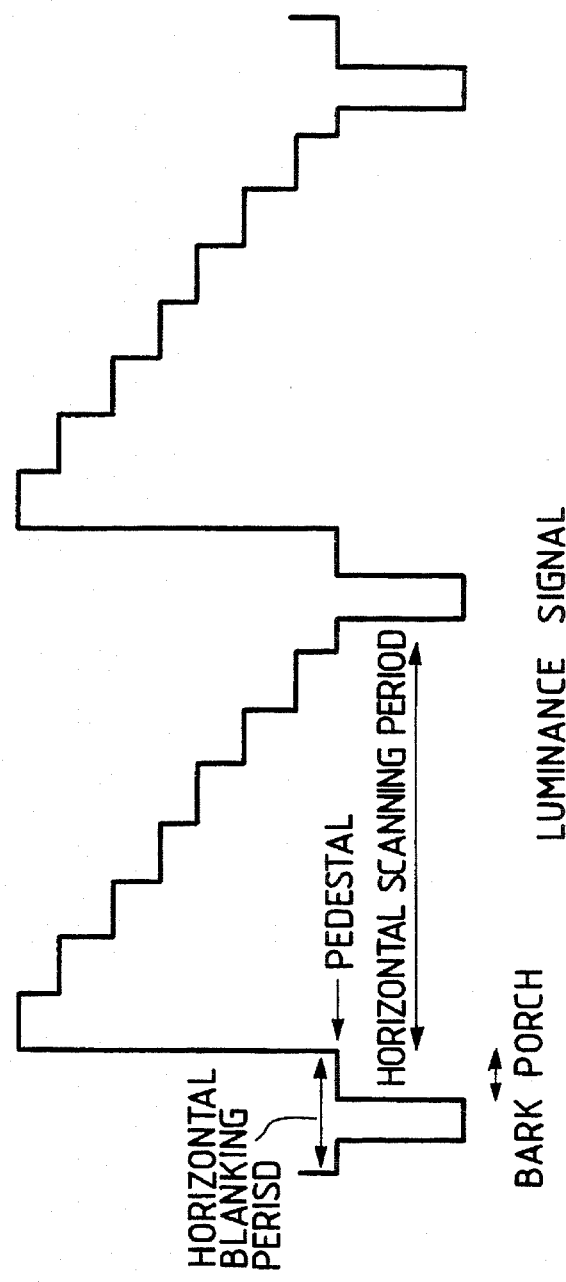
FIGS. 2A and 2B are timing charts showing waveforms of signals at points A and B in the block diagram of FIG. 1.
Figure 2B:
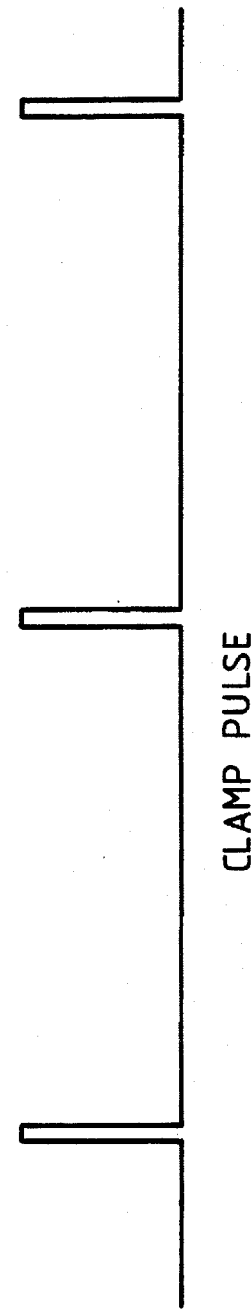

FIGS. 2A and 2B show the input signal in FIG. 1 and timings of the clamp pulse for this input signal. More specifically, FIG. 2A shows a color bar luminance signal (Y+S), and FIG. 2B shows the clamp pulse. In the arrangement shown in FIG. 1, the digital feedback clamp circuit of this embodiment is operated in the same manner as described in the "Related Background Art". The pedestal portion of the input video luminance signal is maintained at the 01H level of the digital data.

Figure 3A:
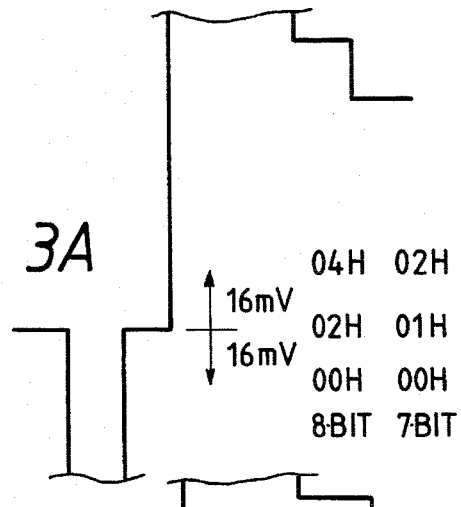
FIGS. 3A, 3B and 3C are waveform charts showing clamp precision of the digital feedback clamp circuit when A/D conversion gradation bits are changed in the circuit shown in FIG. 1.
Figure 3B:
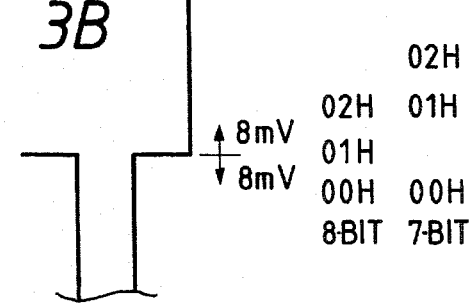

Since the difference between 8-bit gradation data and 7-bit gradation data in digital processing of the luminance signal is almost not noticeable in a conventional industrial video camera, a system is provided in which digital signal processing including A/D conversion is performed by 7-bit gradation data so as to reduce the memory capacity. In this case, when the conventional digital feedback clamp operation is performed, an error of ±1 bit occurs in A/D-converted data of the pedestal portion of the input signal due to noise and quantization noise. When A/D conversion is performed in an input range of $2_{VP-P}$, the least significant bit (1LSB) has a level of about 16 mV. Therefore, a clamp operation having a variation of ±16 mV is performed. This variation of ±16 mV causes a 6-mV variation of the input signal as a whole, as shown in FIG. 3A. Precision of digital signal processing upon A/D conversion is degraded.

In this embodiment of the present invention, in order to improve precision of digital feedback clamp processing for performing digital signal processing using a 7-bit gradation memory, the A/D converter 1, the latch circuit 2, and the comparator 3 in FIG. 1 are assigned with 8-bit gradation. When the input signal is set to have a range of $2_{VP-P}$ and 8-bit A/D conversion is performed, the 1LSB has a variation of ±8 mV, thereby greatly improving precision as compared with 7-bit A/D conversion.

At present, 8-bit A/D converters are available as general-purpose converters at low cost. Even if 7-bit gradation digital signal processing is to be performed, an 8-bit A/D converter can be used. In this case, 8-bit digital feedback clamp processing is almost no different from 7-bit digital feedback clamp processing. When digital signal processing is performed using the 7-bit gradation memory 8, the digital feedback clamp processing including A/D conversion is performed with 8-bit gradation, thereby obtaining excellent clamp precision requiring almost no change in the conventional circuit.

Another Embodiment

Another embodiment of the present invention will be described below.

In the first embodiment described above, in the system for performing digital signal processing using the 7-bit gradation memory 8, 8-bit gradation digital feedback clamp processing is performed to double the clamp precision. In general, in a system for performing digital signal processing using an n-bit gradation memory, clamp precision can be doubled by using an n+1 -bit gradation digital feedback clamp circuit.

Figure 3C:
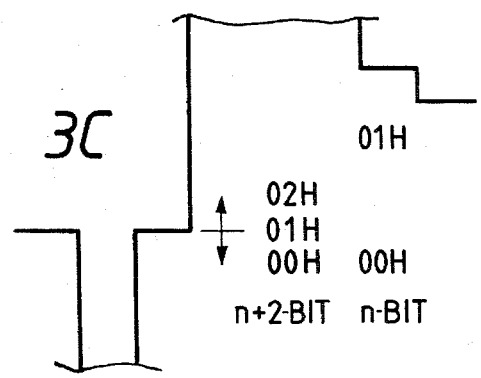
Figure 4:
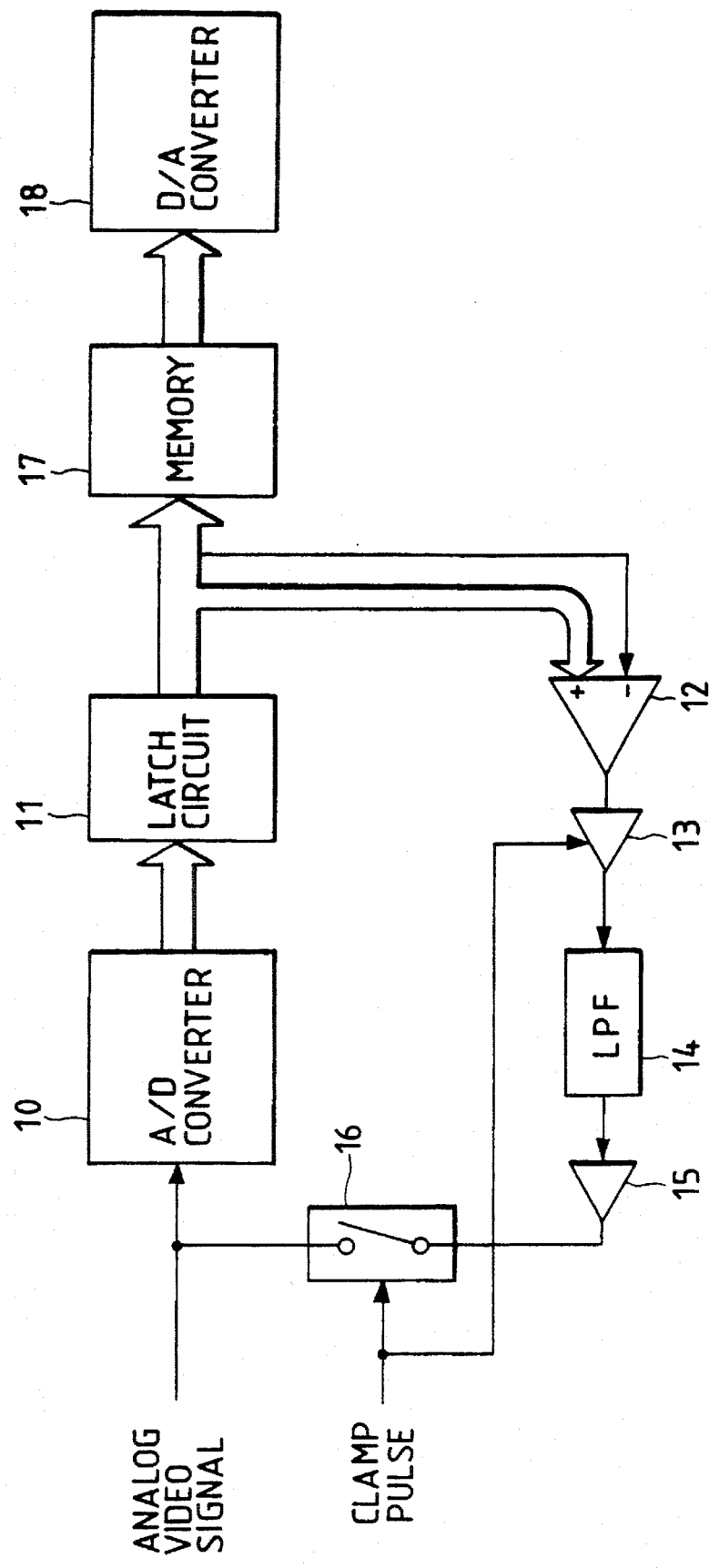
FIG. 4 is a block diagram showing an arrangement of a conventional digital feedback clamp circuit.

In addition, in the system for performing digital signal processing using the n-bit gradation memory, when an n+2-bit gradation digital feedback clamp circuit is used, influences of variations upon clamping of the input signal on the digital signal can be reduced to zero by converting the n+2-bit gradation into n-bit gradation upon A/D conversion. More specifically, in this case, as shown in FIG. 3C, all variations in the input signal caused by clamp upon an n+2-bit gradation digital feedback clamp operation are included within the range of 1LSB of the 7-bit gradation. Therefore, an error caused by clamp variations does not adversely affect n-bit gradation digital signal processing at all, and high-precision digital processing can be performed.

According to this embodiment, as has been described above, in the digital feedback clamp circuit connected to the input to the A/D converter for performing digital signal processing, the error of ±1LSB caused by noise or an A/D conversion quantization error generally causes variations in the input signal. According to the present invention, however, data is stored in the memory after A/D conversion, A/D conversion is performed with a larger number of gradation bits than that of digital signal processing by one bit, and the digital feedback clamp processing is performed. Therefore, influences of variations in input signal during clamping can be eliminated, and high-precision digital signal processing can be performed.

Another embodiment of the present invention will be described with reference to FIG. 5.

Figure 5:
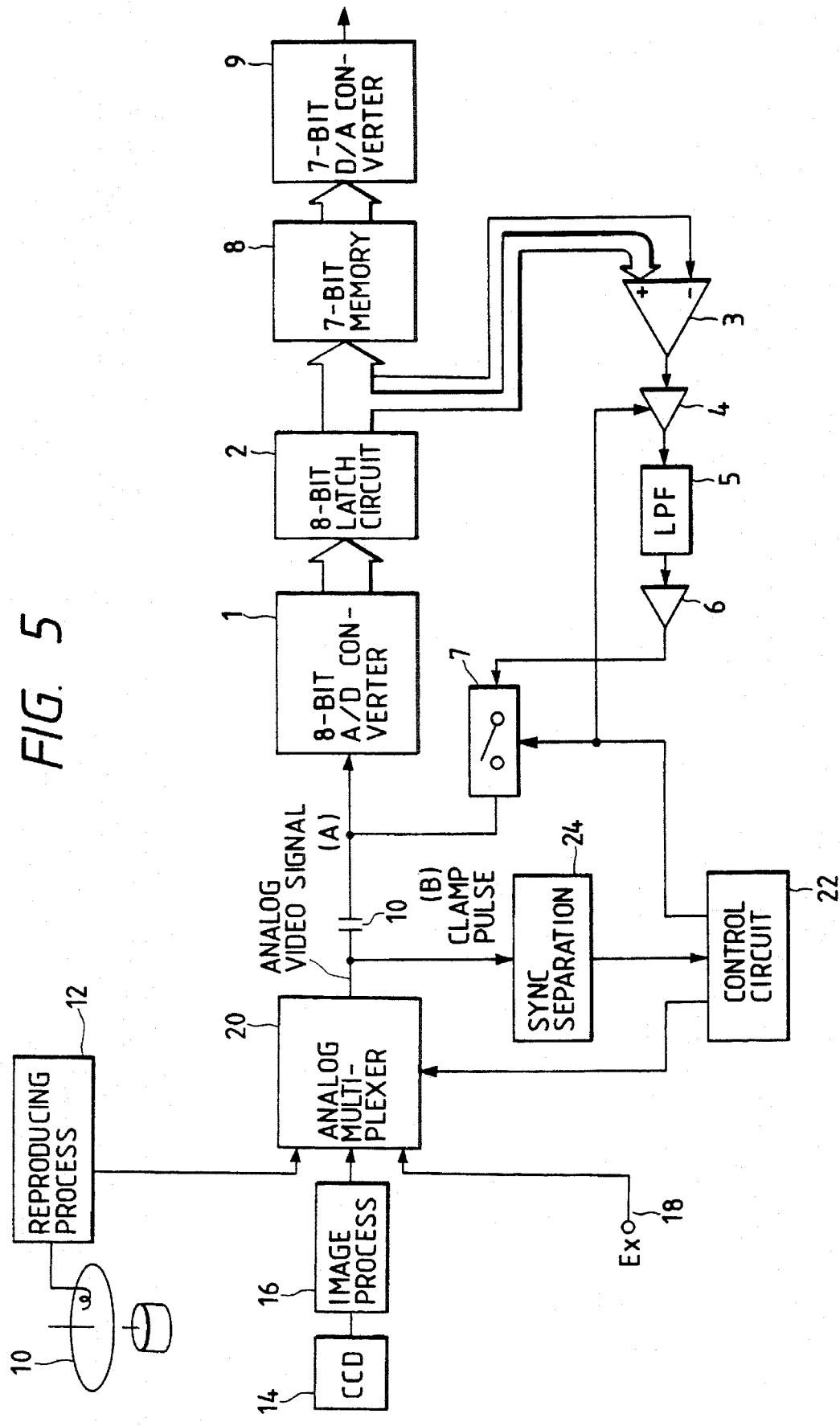
FIG. 5 is a block diagram showing an arrangement of a digital feedback clamp circuit according to another embodiment of the present invention.

The same reference numerals as in FIG. 1 denote the same parts in FIG. 5, and a detailed description thereof will be omitted.

A recording medium 10 comprises, e.g., a magnetic disk. A reproducing process circuit 12 processes a signal reproduced from the recording medium 10. A photoelectric conversion element 14 comprises, e.g., a CCD for photoelectrically converting a target color image into primary color (R, G, and B) signals. An image process circuit 16 processes the R, G, and B color signals output from the photoelectric conversion element 14. An external input terminal 18 processes an external video signal.

A control circuit 22 controls a selection state of a multiplexer 20 and generates a clamp pulse in accordance with a detected selection state of the multiplexer 20. The control circuit 22 generates the clamp pulse in response to a horizontal sync signal output from a sync separation circuit 24.

In this embodiment, since the signal reproduced from the recording medium 10 has a relatively high possibility of containing a noise or jitter component, the control circuit is operated such that a clamp pulse having a relatively long duration is generated and a clamp pulse having a duration shorter than that of the clamp pulse for the recording medium is supplied for a signal having a small number of jitter components and output from a CCD or the like.

A stable clamp operation can be achieved regardless of different input sources.

What is claimed is:

1. An apparatus for processing an image signal including a synchronizing signal comprising:

means for inputting plural kinds of input image signals;

means for removing the synchronizing signal from the input image signal;

means for clamping the input image signal with the synchronizing signal removed;

an A/D converter for converting said input image signal with the synchronizing signal removed into an m bit digital signal;

means for controlling said clamping means in accordance with an m bit digital image signal portion of the m bit digital signal converted by said A/D converter and for controlling a pulse width of a clamp pulse according to the kind of input image signal;

means for extracting an upper n-bit digital image signal (n<m) of said m bit digital signal; and processing means for processing said n bit digital image signal extracted by said extracting means.

2. An apparatus according to claim 1, further comprising:

means for generating said image signal.

3. An apparatus according to claim 2, wherein said generating means comprise a reproducing device.

4. An apparatus according to claim 2, wherein said generating means comprise an image pick up device.

5. An apparatus according to claim 1, wherein said processing means includes memory for memorizing said n bit digital image signal.

6. An apparatus according to claim 1, wherein said controlling means includes:

D/A convertor for converting said m bit image signal into an analog image signal; and clamp circuit for clamping said input image signal in accordance with said analog image signal.

7. An image processing apparatus comprising:

means for inputting plural kinds of input image signals;

clamping means for clamping said input image signals; and means for controlling clamping of said clamping means including controlling a clamp pulse width in accordance with said kind of input image signal.

8. An apparatus according to claim 7, wherein said controlling means controls a clamp period of said clamping means.

9. An apparatus according to claim 7, wherein said controlling means controls a length of a clamp period of said clamping means.

10. An apparatus according to claim 7, further comprising:

A/D convertor for converting said input image signals into digital image signals.

11. An apparatus according to claim 10, further comprising:

means for memorizing said digital image signals.

12. An apparatus according to claim 11, wherein said inputting means comprise a reproducing device.

13. An apparatus according to claim 11, wherein said inputting means comprise an image pick up device.

14. An apparatus according to claim 7, wherein said inputting means includes:

a plurality of input sources for inputting a plurality of analog input signals;

selector for selecting one of said plurality of input sources.

15. An apparatus according to claim 14, wherein said clamping-means includes:

a clamp circuit for clamping a predetermined portion of said input image signals.

* * * * *